United States Patent [19]

Brunsting et al.

[11] 3,877,020

[45] Apr. 8, 1975

[54] PAIRED TRANSITION REBALANCING PULSE FOR VOLTAGE TO FREQUENCY CONVERTERS

[76] Inventors: Allen W. Brunsting, 5750 Wing Ave., S.E., Kentwood, Mich. 49508; Harvey D. Stark, 9805 Nimrod Rt. No. 2, Lowell, Mich. 49331

[22] Filed: June 27, 1972

[21] Appl. No.: 266,601

[52] U.S. Cl. .......................................... 340/347 AD

[51] Int. Cl. .......................................... H03k 13/02

[58] Field of Search ................ 340/347 NT, 347 AD

[56] References Cited

UNITED STATES PATENTS

| | | | |
|---|---|---|---|
| 3,461,390 | 8/1969 | Mack | 178/88 |
| 3,465,249 | 9/1969 | Jousset | 340/347 NT |
| 3,500,384 | 3/1970 | Naydan | 340/347 NT |
| 3,564,538 | 2/1971 | Bonzect | 340/347 NT |
| 3,665,457 | 5/1972 | Wiable | 340/347 NT |
| 3,688,305 | 8/1972 | Goldsworth | 340/347 NT |

*Primary Examiner*—Thomas J. Sloyan

[57] ABSTRACT

An integrator type voltage to frequency converting circuit including a switchable current rebalancing source for rebalancing the input to the integrator. The rebalancing current source is controlled to provide paired transition rebalancing pulses for linear and symmetrical operation of the converter.

1 Claim, 4 Drawing Figures

PAIRED TRANSITION REBALANCING PULSE FOR VOLTAGE TO FREQUENCY CONVERTERS

BACKGROUND OF THE INVENTION

The present invention relates to voltage to frequency converters and particularly to such converters of the integrating type utilizing a balancing scheme whereby an energy source for paired transition rebalancing pulses is digitally balanced against the system input.

Conventional integrating voltage to frequency converters or analog to digital converters are or ternary binary in operation. These converters have not been capable of providing performance goals of linearity, symmetry, and bias stability required in critical applications. One reason for the lack of accuracy in such converters is that positive and negative rebalance current pulses are unequal; another that consecutive rebalance pulses do not contain like amounts of energy; or, the combination thereof.

The energy sources commonly employed for generating rebalance pulses are capacitors, inductors, or switched resistors. The capacitor suffers from switches which either absorb or add energy to the rebalance current in a non-symmetrical manner. The inductor or saturable reactor has the problem of temperature sensitivity and, to a lesser extent, lack of symmetry between pulses of different polarity. The switched resistor, as the capacitor, also suffers from the loss or gain of transient energy attributable to switching.

SUMMARY OF THE INVENTION

The present invention overcomes the aforementioned bias stability, symmetry and linearity problems in the output of the converter by applying paired transition rebalancing pulses at its integrator input. The paired transition rebalancing pulse is of a particular waveform defined by paired on and off switching of current of positive and negative polarity within the period of the pulse. The rebalancing pulse must have a net polarity with the intervals of switch on being of sufficient duration to permit build up of current to a given amplitude, and the intervals of switch off being of sufficient duration to permit complete decay of the prior current. Another constraint is that the intervals of switching must be of equal duration as those used in the previous or succeeding periods of other paired transition rebalancing pulses.

Converters embodying the present invention include an integrator, a comparator, a logic circuit and a rebalance constant current source. The basic operating principle is a feedback balancing scheme whereby a rebalance constant current source is digitally balanced against the system input. The integrator acts as the averager and the comparator tells which direction the rebalance must be applied. The logic takes this information, gives an output and actuates the rebalance source.

It is an object of the present invention to provide a current rebalancing source for a voltage to frequency converter to improve linearity, symmetry and bias stability performance.

It is an additional object of the present invention to provide a voltage to frequency converter employing a ternary loop having a deadband zone during which rebalancing pulses are not balanced against the incoming signal.

It is still a further object of the present invention to use a switchable current rebalancing source for providing rebalance current pulses to the current summing node of the integrat or of the converter.

It is still a further object of the present invention to provide a switchable current rebalancing source for generating paired transition rebalance pulses.

Another object of the present invention is a method of switching a rebalancing current source.

An additional object of the present invention is to use a feedback circuit for generating paired transition rebalance pulses from a switchable rebalance current source to the summing node of the integrator of the voltage to frequency converter.

These and other objects of the present invention will become apparent upon reading the following specification together with the accompanying drawings.

DETAILED DESCRIPTION OF THE PREFERRED EMBODIMENT

Figure 1:
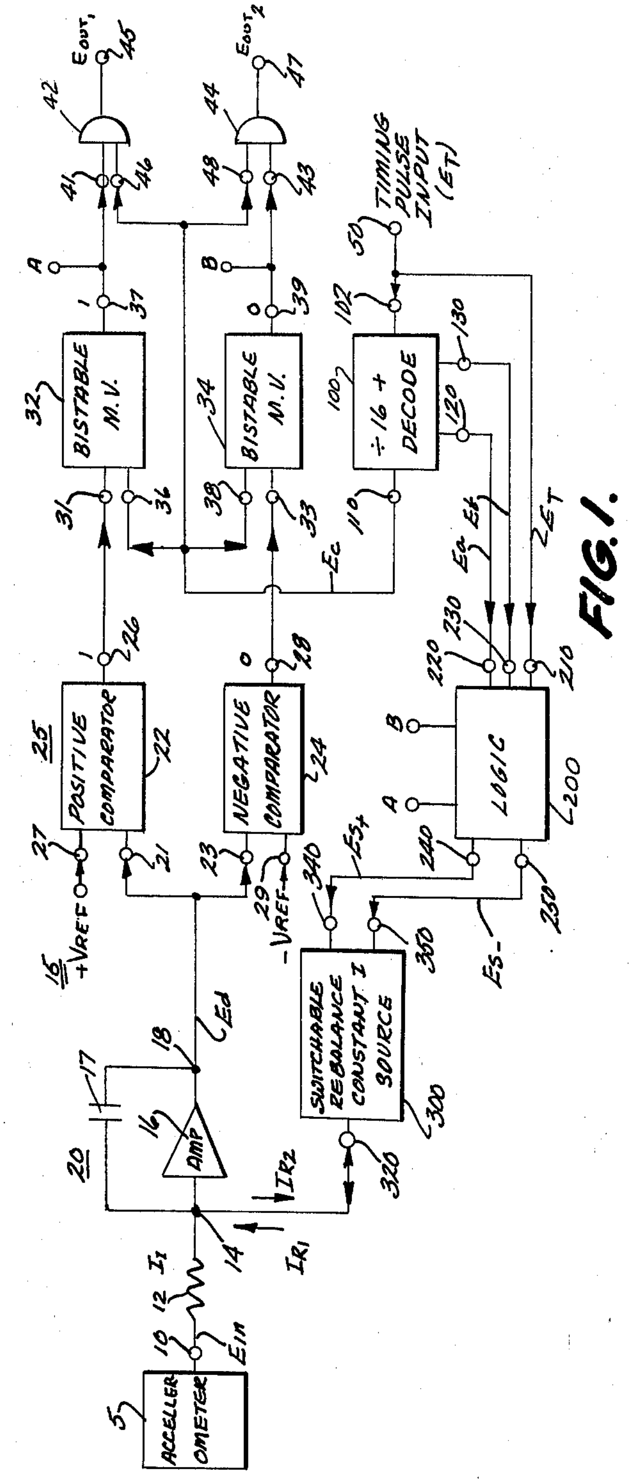
FIG. 1 is an electrical circuit diagram in block diagram form of a converter embodying the present invention.

Referring now to FIG. 1 there is shown a block diagram of the electrical circuit embodying the present invention. In the figure, an accelerometer 5 develops a varying electrical signal ($E_{in}$) which is applied to an input terminal 10 of the converter. The converter can be used with any source of analog signals which are desired to be converted into digital signals (pulses) having a frequency related to the amplitude of the input signals. When an accelerometer 5 is the source, the input voltage $E_{in}$ may typically vary between plus and minus 7 to 10 volts. $E_{in}$ may have frequency components, for example, of up to 200–300 Hz which are background vibration components of relatively low amplitude; and the intelligence carrying information which can range from D.C. to approximately 1Hz or greater depending upon the motion of the device in which the accelerometer is installed. These input signals are illustrative only, the circuit being capable of converting analog signals having different frequencies and voltage levels equally as well.

Figure 2:
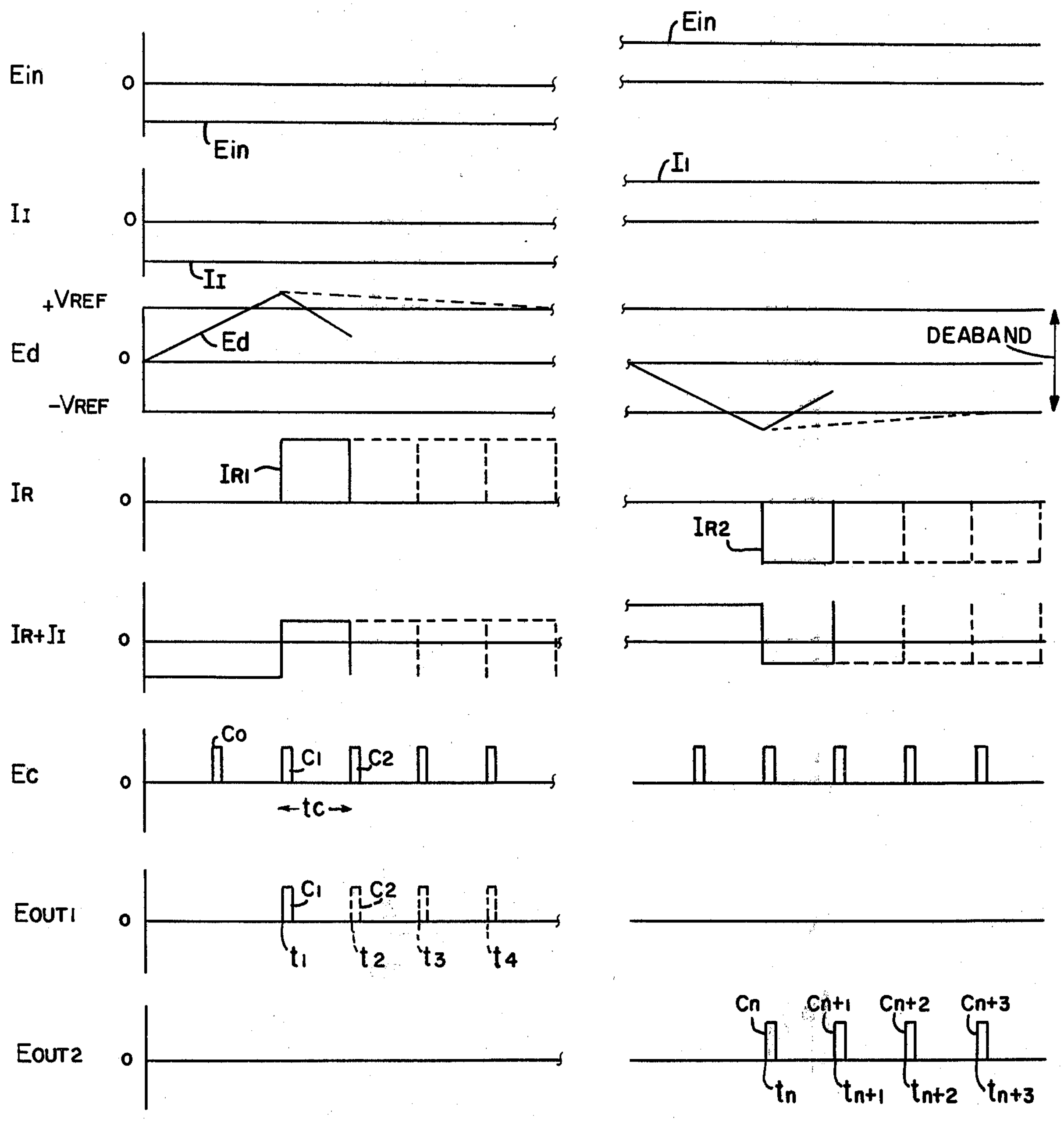
FIG. 2 is a series of time related waveforms representing electrical voltage and current signals at various locations in the circuit of FIG. 1.

Input terminal 10 connects through resistor 12 to the integrating circuit 20 which in turn connects to comparators 25. The integrator 20 includes an operational amplifier 16 having a current summing node 14 and an output terminal 18. The positive direction of flow of the input current $I_I$ resulting from applying the input analog voltage $E_{in}$ across resistor 12 is indicated by the arrow in FIG. 1. Integration is accomplished by means of an integrating capacitor 17 coupled between terminals 14 and 18 of the amplifier. The voltage at output terminal 18 is inversely related to the voltage at input terminal 10 and is represented by the waveform of FIG. 2 identified by the symbol $E_d$. The voltage $E_d$ is applied to input terminals 21 and 23 of a pair of comparators 22 and 24, respectively. The comparators provide output control signals when the voltage $E_d$ raises above the positive reference voltage (+Vref) applied to input terminal 27 of comparator 22 or falls below the negative reference voltage (−Vref) applied to input terminal 29 of comparator 24.

The output signals at output terminals 26 and 28 of the comparators 22 and 24, respectively are applied to a pair of clocked bistable multivibrators 32 and 34 at input terminals 31 and 33, respectively. Multivibrators 32 and 34 have output terminals 37 and 39, respectively, that are coupled to input terminals 41 and 43, respectively, of a pair of AND gates 42 and 44. The AND gates 42 and 44 have output terminals 45 and 47, respectively, which provide the digital output signals for the converter. Signals at output terminal 45 are represented by the waveform $E_{out1}$ of FIG. 2 and comprise pulses which are present at terminal 45 when the voltage $E_d$ is greater than +Vref. Signals at output terminal 47 are represented by the waveform $E_{out2}$ of FIG. 2 and comprise pulses which are present at terminal 47 when the voltage $E_d$ is less than −Vref.

Figure 4:
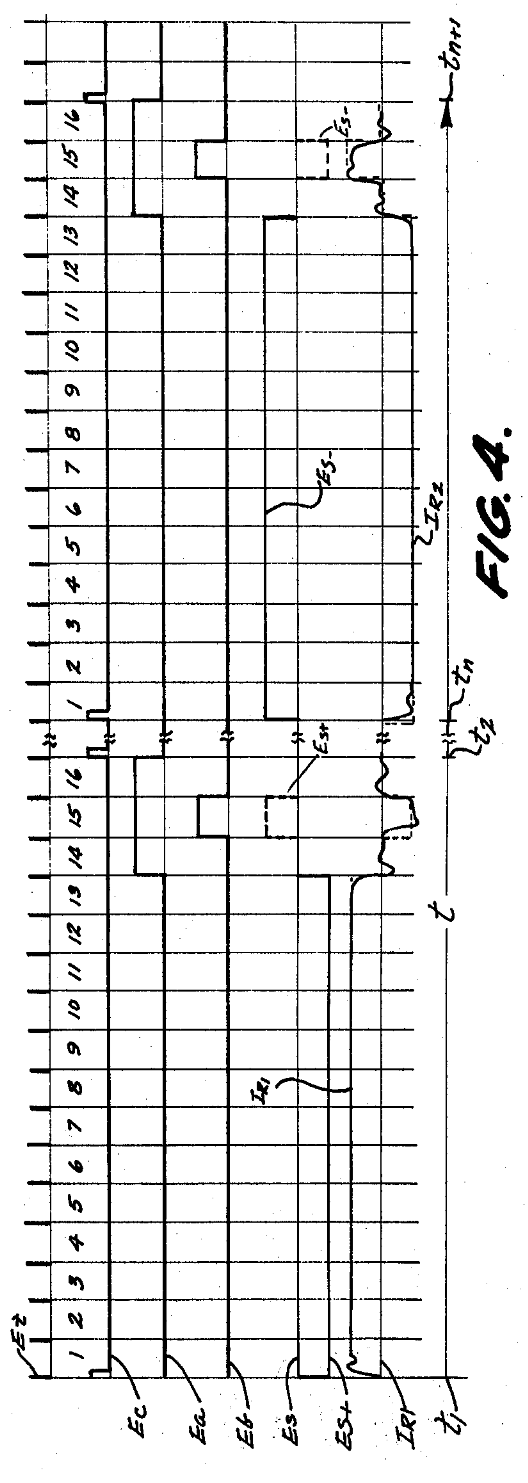
FIG. 4 is a series of time related waveforms corresponding to electrical signals at various locations within the circuits of FIG. 1 and 3 shown in a time-expanded scale as compared with the waveforms of FIG. 2.

Clock pulses are applied to clock pulse input terminals 36 and 38 of the multivibrators 32 and 34, respectively, as well as input terminals 46 and 48 of the AND gates 42 and 44, respectively. The clock pulses are represented in FIGS. 2 and 4 by the waveform identified by the symbol $E_c$ and are derived from a suitable source of timing pulses shown in FIGS. 2 and 4 by the waveform identified by the symbol $E_T$. The timing pulses $E_T$ are applied to an input terminal 50 of the converter circuit which, in turn, is coupled to an input terminal 102 of a dividing and decoding circuit 100. Circuit 100 includes an output terminal 110 coupled to the clock pulse input terminals of the multivibrators 32 and 34 and to the input terminals of the AND gates 42 and 44. In the preferred embodiment, the timing pulse frequency was 100 KHz. Circuit 100 frequency divides these signals by 16 to obtain clock pulses ($E_c$) of 6.25 KHz.

The input pulses $E_T$ are also applied to an input terminal 210 of a logic circuit 200. Output terminals 120 and 130 of the decoding circuit 100 are coupled to input terminals 220 and 230 of the logic circuit 200, respectively. As described below, the voltage developed by the decoding circuit at terminals 120 and 130 is represented by the voltage waveforms $E_a$ and $E_b$, respectively and shown in FIG. 4. The output terminals of the bistable multivibrators 32 and 34 are likewise coupled to the logic circuit 200 by interconnecting terminals A and interconnecting terminals B.

The logic circuit 200 responds to the input signals to develop timed positive switching signals which are represented by the waveform $E_{s+}$(FIG. 4) present at an output terminal 240 and timed negative switching signals represented by the waveform $E_{s-}$in FIG. 4 at an output terminal 250. These switching voltages are applied to input terminals 340 and 350 of a switchable rebalance constant current source 300 which has an output terminal 320 coupled to the current summing node 14 of the integrating amplifier circuit 20. The circuits 200 and 300 thereby form in effect a negative feedback loop coupling the integrator 20 output to the input terminal of the detector. Having described the interconnected relationship of the various circuits, a general description of the operation of the circuits will first be presented, followed by a discussion of the individual circuits shown in FIG. 3.

For the purposes of discussion of the operation of the circuitry shown in FIG. 1, it is assumed that the input voltage $E_{in}$ is negative such that the output voltage $E_d$ at terminal 18 of the integrator will be a positive going voltage as indicated in FIG. 2. FIG. 2 is divided into left and right segments, the left segment showing the waveforms for the assumed negative input voltage $E_{in}$ whereas the right section shows waveforms for positive input voltage $E_{in}$. The voltage range between the positive reference voltage (+Vref) and the negative reference voltage (−Vref) of the comparators 22 and 24, respectively defines a deadband region of operation for the circuit. As long as the output voltage $E_d$ of the integrator 20 does not exceed the positive reference voltage (+Vref) and is not less than the minus reference voltage (−Vref) no rebalance current is supplied to the summing node 14.

As the negative input voltage $E_{in}$ remains at a relatively constance value the output voltage $E_d$ at terminal 18 of the amplifier 16 rises as shown in FIG. 2 until it crosses the positive reference voltage level. As this occurs, the comparator 22 switches states to provide a logic "1" output signal indicated by the "1" adjacent the output terminal 26 of the comparator. The logic "1" output signal from the positive comparator is applied to the bistable multivibrator 32 such that when the next clock pulse ($C_1$ in FIG. 2) is applied to the multivibrator, it will change states and switch to provide a logic "1" output. This is indicated by the "1" adjacent output terminal 37 of the multivibrator.

Referring to the clock pulse waveform $E_c$ in FIG. 2, it is seen that the output voltage $E_d$ crosses the positive reference level after the clock pulse $C_0$ such that the multivibrator 32 will not change states until time $t_1$ shown in the time axis of the waveforms of FIG. 2 (i.e. when clock pulse $C_1$ is applied to the multivibrator 32). The logic output "1" signal at terminal 37 conditions the AND gate 42 to pass the same clock pulse $C_1$ through the gate and present it as the output pulse shown in solid lines in the waveform diagram $E_{out1}$.

The output signal from the bistable multivibrator 32 is further coupled to the logic circuit 200 which also receives signals from the decode circuit 100 and develops a switching signal $E_{s+}$ to control the current source 300 to supply a pulse of current $I_{R1}$ (shown in waveform $I_R$ of FIG. 2). The current pulse which combines in an opposing manner with the input current $I_I$ to reduce the input current to the summing node 14 of the integrator.. With the negative input voltage $E_{in}$ assumed, the input current $I_I$ flows in a negative direction. The pulse of positive current $I_{R1}$ combines with the negative input current $I_I$ during the time period $t_1$–$t_2$ (i.e. the clock pulse interval indicated in the figure as $\tau_c$) to provide the resultant waveform labeled as $I_I + I_R$. The resultant current $I_I + I_R$ as the consequence of flowing through the capacitor 17 generates a negative going voltage to reduce the integrator output voltage $E_d$.

If the single pulse of current $I_{R1}$ during the $t_1 - t_2$ interval is sufficient to drive the output voltage $E_d$ below the positive reference voltage level; the output of comparator 22 will return to the zero logic state thereby causing the multivibrator 32 to switch to the zero output state when the clock pulse $C_2$ at time $t_2$ is applied to input 36 of the multivibrator. If this occurs, only a single output pulse (as shown in solid lines in waveform $E_{out1}$ of FIG. 2) will be applied to output terminal 45.

If, however, the input voltage is sufficiently large such that more than one rebalance current pulse $I_{R1}$ is required, the output voltage $E_d$ will remain above the reference voltage level as indicated by the dashed line portion of the waveform diagram $E_d$. In such case, the comparator and bistable multivibrator outputs will remain at the "1" level for successive clock pulse intervals $t_2$–$t_3$, $t_3$–$t_4$, and $t_4$–$t_5$. This condition is indicated by the dashed line waveforms of $E_d$, $I_I$, $I_R$ and $E_{out1}$, where it is seen that the rebalanced current pulse $I_{R1}$ extends for four clock pulse intervals until the voltage $E_d$ again drops below the reference voltage level. The output voltage $E_{out1}$ at terminal 45, therefore, comprises a series of four pulses. Similarly, the output signal at terminal 45 will be related to the amplitude of any input voltage. Thus, for a maximum input voltage at terminal 10 the output voltage at terminal 45 (or 47) will be a continuous stream of pulses and the rebalance current pulses will be consecutive to drive the current at node 14 back to zero. When the amplitude of the input voltage is relatively small, however, only a few balanced current pulses may be required; thus, only a few output pulses will be present at one of the output terminals.

when the input voltage $E_{in}$ is positive instead of negative, as shown by the waveform diagrams to the right in FIG. 2 the current directions are reversed and the comparator and multivibrator 24 and 34, respectively, together with AND gate 44 are operative to provide output pulses at terminal 47. With a positive input signal, the negative comparator 24 is actuated to provide a logic "1" output which conditions the bistable multivibrator 34 to provide a logic "1" output signal when a clock pulse is received. Thus, the logic output signals associated with the comparators and multivibrators are opposite that shown in FIG. 1 for a positive input signal $E_{in}$. Likewise, the rebalance current pulse is shown in FIG. 1 flowing in the direction indicated by the arrow identified by the symbol $I_{R2}$ flowing from the node 14 instead of toward node 14. In FIG. 2, the rebalance current pulse $I_{R2}$ (shown in the right section) occurs for the interval $t_n$–$t_{n+1}$. If $E_d$ remains below −Vref for a greater time, as indicated by the dashed line waveforms of the right section of FIG. 2, the rebalance source 300 provides a series of rebalance current pulses. In FIG. 2, for example, rebalance current pulses are provided over the interval $t_n$–$t_{n+4}$. The corresponding output signals at terminal 47 of gate 44 are shown by waveform $E_{out2}$ in FIG. 2.

In addition to providing a ternary system for converting an analog voltage to a series of digital pulses corresponding in frequency to the amplitude of the input signal, the system's symmetry and linearity are improved over prior art systems by employing paired transitional switching of the rebalanced current source 300. The details of the development of the current pulses $I_{R1}$ and $I_{R2}$ and the switching of the current source 300 is explained in detail with respect to FIGS. 3 and 4.

Initially it is noted that the time scale is greatly expanded in the FIG. 4 waveforms which are divided into left and right sections corresponding to the assumed negative input voltage and a positive input voltage respectively. Only one positive and one negative paired transition rebalancing pulse is shown in detail in FIG. 4, it being understood that as many as necessary to drive the integrator output into the deadband will occur consecutively as explained above. The feedback circuit means coupled between the converter output and the integrator input is shonw in detail in FIG. 3.

Figure 3:
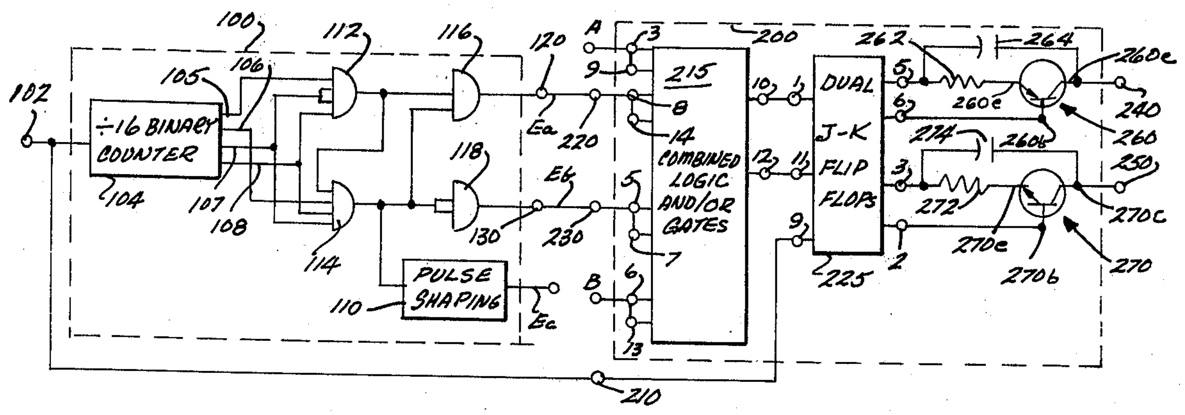
FIG. 3 is a detailed electrical circuit diagram partially in schematic and block diagram form of some of the circuits shown in FIG. 1.
Figure 3:
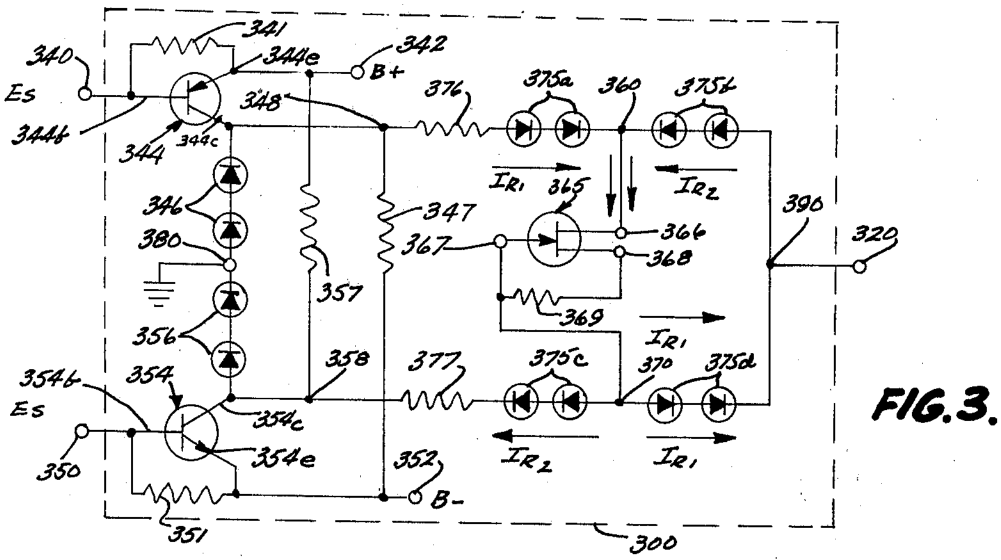

Referring now to FIGS. 3 and 4, it is seen that the input terminal 102 of decode circuit 100 forming a portion of the feedback circuit is coupled to a divide-by-16 binary counter 104. The output of counter 104 includes a divide-by-2 line 105, a divide-by-4 line 106, a divide-by-8 line 107 and a divide-by-16 line 108. Circuit 100 can be constructed of a single integrated circuit such as one manufactured by Texas Instruments, Inc. model SN5493 or its equivalent. The AND gates are interconnected in the preferred embodiment as shown to provide the output signals. It is understood that any suitable array of logic circuits could however be employed to develop these signals.

The input timing pulses ($E_T$) that are applied to input terminal 102 of the counter 104 are divided into pulses having integral submultiple frequencies of the 100 KHz input signals. The lines 104–107 are coupled to input terminals of AND gates 112, 114, 116 and 118 as shown in the figure to provide the signals $E_a$ and $E_b$ (FIG. 4) at output terminals 120 and 130 respectively of circuit 100. Output signal $E_a$ is positive during only the fourteenth through sixteenth timing pulse ($E_t$) intervals (as numbered in FIG. 4), whereas output signal $E_b$ occurs only during the 15th timing pulse ($E_t$) interval.

The output of AND gate 114 is coupled to a pulse shaping circuit 115 which applies output clock pulses $E_c$ to the output terminal 110 of circuit 100. The clock pulse $E_c$ oocurs at each 16th timing pulse ($E_t$) and is shaped to be somewhat narrower than a timing pulse interval. The timing relationship of the input pulses $E_t$, the clock pulses $E_c$ and the signals $E_a$ and $E_b$ is shown by the first four waveforms of FIG. 4. Each clock pulse interval is divided into sixteen timing pulse intervals labeled 1–16 in the figure.

The output terminals 120 and 130 of the circuit 100 are coupled to input terminals 220 and 230 respectively of the logic circuit 200. Additionally, timing pulses applied to input terminal 50 of the converter (FIG. 1) are applied to an input terminal 210 of the logic circuit 200. Finally, signals from the multivibrators 32 and 34 are applied to logic circuit 200 by interconnected terminals A and B respectively to supply polarity indicating information thereto. The logic circuit matrixes the various incoming signals at terminals 210 through 230 and A to B to provide at output terminals 240 and 250 switching voltages represented by waveforms $E_{s+}$and $E_{s-}$respectively, shown in detail in FIG. 4 and discussed below.

Circuit 200 comprises a combined logic AND/OR gates circuit 215 together with a dual J-K flip-flop circuit 225, both of which are available from Texas Instruments, Inc. Circuit 215 is a Texas Instruments model No. SN 5450 integrated circuit and circuit 225 is a Texas Instruments model No. SN 54H108 integrated circuit. It is understood that these particular circuits or their equivalents can be employed. The terminal numbers indicated within the dashed line portion of circuit 200 correspond to the manufacturer's terminal number identification.

Circuits 215 and 225 operate to matrix the incoming voltages and apply the resulting signal at output terminals 5 and 6 of circuit 225 to a first switching transistor 260 having base collector and emitter terminals. The base terminal 260*b* of transistor 260 is coupled to output terminal 6 of circuit 225. The emitter terminal 260*c* of transistor 260 is coupled to output terminal 5 of circuit 225 by means of a resistor 262. A capacitor 264 is coupled between the emitter terminal 260*e* and the collector terminal 260*c* which is also coupled directly to the output terminal 240 of the logic circuit 200.

Output terminals 2 and 3 of the circuit 225 are coupled to a second switching transistor 270 having base, collector and emitter terminals. The base terminal 270*b* of transistor 270 is coupled to output terminal 2 of circuit 225. The emitter terminal 270*e* of transistor 270 is coupled to the output terminal 3 of circuit 225 by means of a resistor 272. A capacitor 274 is coupled between the output terminal 3 of circuit 225 and a collector terminal 270*c* of transistor 270 which is further coupled directly to the output terminal 250 of the logic circuit 200.

The output voltage $E_{s+}$ which occurs when the output of multivibrator 32 is at a logic "1" state is shown in detail by the waveform $E_{s+}$ of FIG. 4. In the waveform diagram $E_{s+}$, the solid line portion corresponds to the signal at terminal 240 while the dashed line portion corresponds to the signal at terminal 250. Thus it is seen that $E_{s+}$ is negative going for the timing pulse ($E_t$) intervals 1 through 13, zero during timing pulse interval 14, positive during timing pulse interval 15; and returns to zero during the timing pulse interval 16. The output switching voltage $E_{s-}$ which occurs when the multivibrator 34 has a logic "1" output signal is shown by the waveform $E_{s-}$ in FIG. 4. The solid line components of $E_{s-}$ appear at terminal 250 and dashed line components at terminal 240. The waveform $E_{s-}$ is positive between the timing pulse intervals 1 through 13 in the right-hand segment of the FIG. 4 waveforms, zero during timing pulse interval 14, negative during timing pulse interval 15; and zero during timing pulse interval 16. These switching voltages ($E_{s+}$) and $E_{s-}$) provide the paired transitional switching for the rebalance current source 300.

The effect of paired transitional switching to provide symmetrical and linear current rebalancing pulses is best seen by the waveform diagram $I_R$ shown in FIG. 4. A theoretically perfect rebalance current pulse, i.e. one with zero rise and fall time is illustrated by the dashed line portion of waveforms $I_R$. Successive theoretical pulses of this type would always add (in total energy content) to an integer multiple of a single pulse and therefore provide a linear response characteristic for this converter. Similarly, positive and negative pulses of this type would be equal in width and have identical energy content. Consequently the theoretical pulses of opposite polarity would be symmetrical and have bias stability (zero bias). In practice however, the leading and trailing edges of the current rebalancing pulses have finite rise and fall times due to the transient response characteristics of the current source switches.

The transients at the leading edge of the pulse due to the rise time, reduce the total energy of the pulse while the transients at the trailing edge of the rebalance pulse, due to the fall time of the pulse, width and add to the total pulse width and energy. Thus by switching the rebalance current pulse on and off over a rebalance period a given net change in total energy per pulse as compared with the theoretical total energy is effected.

Previously, when a series of consecutive pulses of the same polarity were required to rebalance the integrator input $I_i$, the rebalancing current was switched on for a time equal to the sum of the successive pulse periods. Consequently, since only one switch-on transient and one switch-off transient is needed for a consecutive series of pulses, the net change of energy due to such transients is the same as that incurred in the switch-on and switch-off for a single pulse. Therefore, the average net change of energy per pulse in the consecutive series of pulses is of a different magnitude than that for a single pulse. Even between different consecutive series of pulses, the average net change in energy per pulse will vary, depending upon the number of pulses in each series. This difference in the net change of energy between the pulses generates the error of non-linearity in the output frequency relationship.

When pulses of different polarities are required, the respective switches for positive and negative current are turned on and off for a duration sufficient to generate the respective pulse. The total energy per positive pulse, as compared with that of the negative pulse, will vary due to the transient loss or gain characteristic of the respective switch. Consequently, this variance of total energy between pulses of different polarity establishes a non-symmetrical relationship between such pulses. Also, because of the difference in energy in the positive pulse with respect to negative pulses, a bias will result. This bias, in turn, will fluctuate from one series of rebalancing pulses to another, depending on the preponderances of negative or positive pulses in the given series.

By providing paired transition rebalancing pulse, linearity, symmetry and bias stability between rebalanced pulses is attained. The said pulse is generated by multiple switching of the positive and negative rebalanced current at discreet intervals within the pulse period. The sequence or order of switching is not fixed. However, the current of desired polarity must be switched on for a substantially longer duration than the current of opposite polarity. Also, the switching of current on must, in each instance, be followed by an interval in which the current is switched off, said interval being of such duration as to permit complete current decay. Further, the specific intervals in which current is switched on and off must be equal in duration with the same intervals making up the preceding as well as successive rebalanced pulses.

In this manner, the net change of total energy per pulse will be constant and the pulse outputs in linear relationship. A series of consecutive rebalanced pulses is now not used, but instead will be provided for by a series of single pulses derived by multiple switching. Additionally, symmetry and bias stability between pulses of different polarity is accomplished since each pulse period contains both positive and negative rebalanced current, along with constant switching transient error. It is seen that by employing the paired transitional scheme, as for example the one shown in FIG. 4 where the fourteenth, fifteenth and sixteenth timing pulse intervals are employed for switching, some net loss of rebalancing current occurs since the rebalance current is reversed for at least one timing pulse interval. The amplitude of the output current from the current source however can be chosen such that sufficient rebalance current will be supplied to provide the desired rebalancing of the integrator in the detecting means. Having described the method of paired transitional switching of the rebalance current source, a description of the source follows.

The switching voltages $E_{s+}$ and $E_{s-}$ developed by the logic circuit 200 are each applied to both terminals 340 and 350 respectively of the constant rebalance current source 300 by connecting terminal 240 to 340 and 250 to 350 as shown in FIG. 1. The source 300 comprises a bridge circuit having terminals 360, 370, 380 and 390. Terminal 380 is a common terminal and is coupled directly to ground as shown in FIG. 3. Terminal 390 is the current output terminal which is directly coupled to the output terminal 320 of the current source 300. A constant current device 365 is coupled between terminals 360 and 370. In the preferred embodiment the constant current device 365 comprises a FET transistor having a drain terminal 366 coupled to terminal 360, a source terminal 368 coupled to terminal 370 of the bridge by means of a bias resistor 369 and a gate terminal 367 which is coupled to terminal 370. The value of resistor 369 is chosen such that the FET transistor 365 was biased near the pinch-off region to provide current stability with ambient temperature variations. Conventional current flow in the FET is from the drain to the source in a direction indicated by the arrows.

The individual legs of the bridge between the four terminals include pairs of unidirectional conductive devices 375*a* through 375*d* that are positioned between the terminals of the bridge as shown in the figure to steer rebalancing current from a terminal 348 toward terminal 360, through the current source 365, and then from terminal 370 toward terminal 390 during a positive rebalance current pulse interval; and from terminal 390 toward terminal 360, through the constant current source 365 and then from terminal 370 toward a second terminal 358 during a negative rebalance current pulse interval. The direction of the rebalance current $I_{R1}$ and $I_{R2}$ in the bridge is indicated by the arrows accompanied by these symbols. It is understood that during each rebalance interval the current reverses for at least one timing pulse interval due to the paired transitional switching. Resistors 376 and 377 are coupled in series with the legs of the bridge including diodes 375*a* and 375*c* respectively and serve as trimming resistors. The value of these resistors is selected to provide equal amplitude positive and negative rebalancing currents thereby compensating for any differences in the diode voltage drops with the bridge.

Operating power for the bridge circuit and the current source 300 is supplied by means of terminals 342 and 352 which are coupled to a source or regulated positive supply voltage (B+) and regulated negative supply voltage (B−) respectively. The positive supply voltage at terminal 342 is selectively coupled to terminal 348 of the bridge circuit by means of driving a PNP switching transistor 344 having base, collector and emitter terminals 344*b*, 344*c* and 344*e* respectively with the $E_{s+}$ switching signal. Transistor 344 has its emitter terminal 344*e* coupled directly to terminal 342, its base terminal 344*e* coupled directly to input terminal 340 to receive the solid line portion of switching voltage $E_{s+}$ and the dashed line portion of $E_{s-}$. Collector terminal 344*c* of transistor 344 is coupled to ground terminal 380 by means of a pair of diodes 346 poled to allow current flow from terminal 380 when transistor 344 is nonconductive to the B− supply through a resistor 347. A resistor 341 is coupled between the base and emitter terminals of transistor 344 to insure transistor 344 will remain nonconductive when no signal is applied to terminal 340 of circuit 300.

Negative rebalancing current $I_{R2}$ is provided by driving switching transistor 354 having base collector and emitter terminals 354*b*, 354*c* and 354*e* respectively into and out of conduction with $E_{s-}$ to provide a current return path from terminal 320 to 352. Base terminal 354*b* of transistor 354 is coupled directly to the input terminal 350 to receive the dashed line portion of $E_{s-}$ and the solid line portion of $E_{s-}$. Emitter terminal 354*e* is coupled directly to the negative voltage supply at terminal 352 and collector terminal 354*c* is coupled to the positive voltage supply at terminal 342 by means of biasing resistor 357 and to ground by means of diodes 356. Diodes 356 conduct when transistor 354 is nonconductive to complete a current path from the B+ supply voltage to ground through resistor 357. A resistor 351 is coupled between the base and emitter terminals of transistor 354 to insure transistor 354 remains nonconductive when no input signal is applied to input terminal 350.

In operation, for example during a positive rebalancing current interval where it is desired to provide $I_{R1}$ to the integrator circuit node 14 (FIG. 1), the $E_{s+}$ signal is applied to input terminals 340 and 350. The negative polarity, solid line portion of $E_{s+}$ causes transistor 344 to conduct to provide a current flowing the direction of $I_{R1}$ shown in FIG. 3 toward the input node 14. This current opposes the current applied to node 14 due to the applied analog signal and causes the voltage $E_a$ at output terminal 18 of the integrator to return to the deadband zone between the plus and minus reference voltages applied to the comparators. During the fourteenth, fifteenth and sixteenth timing pulse intervals of the current rebalancing interval, transistor 344 is turned off. During the fifteenth timing pulse interval a positive polarity voltage (the dashed line portion of $E_{s+}$) is applied to terminal 350 and causes transistor 354 to conduct momentarily causing a reverse current to flow momentarily thereby achieving the paired transitional switching as described above and as shown by the waveform $I_{R1}$ in FIG. 4.

In the event that a single rebalancing period is not sufficient to drive the output of the integrator circuit within the deadband zone, the output signal at terminal A of the multivibrator 32 continues to actuate the logic circuit 200 to cause additional rebalancing current pulses to be applied to the integrator circuit. As many rebalancing current pulses as required therefore are consecutively applied to the current summing node 14 of the integrator until the output of the integrator is driven within the deadband region. During active current rebalancing intervals in which a rebalancing current is applied to the current summing node of the integrator, the AND gate 42 is conditioned to pass clock pulses such that an output pulse exists for each rebalancing current pulse interval. As consecutive active rebalance current pulse periods are required to drive the output of the comparator within the deadband region, a series of output pulses are provided at output terminal 45 thereby indicating that a predetermined amplitude signal is present at the input terminal 10 of the converter. In this manner therefore the output signals from the converter will be directly related in frequency to the amplitude of the input voltage applied to the converter.

When an opposite polarity signal is applied to the input of the converter (i.e. a positive going voltage) a negative rebalancing current pulse $I_{R2}$ is similarly developed by first turning on the transistor 354 with the positive solid line waveform portion of $E_{s-}$ during the 1st through 13th timing pulse intervals of a negative rebalancing interval, and momentarily rendering transistor 344 conductive by means of a negative applied signal corresponding to the dashed line waveform portion of $E_{s-}$ to provide the desired paired transitional switching. It is seen therefore that the converter of the present invention operates with either positive or negative input signals to provide output pulses which are frequency related in a linear and symmetrical fashion to the applied input signal. The clock pulse frequency and amplitude of the rebalancing current is chosen such that the converter can be rebalanced.

It will become apparent to those skilled in the art that various modifications of the present invention can be made without departing from the spirit or scope of the present invention. Such modifications may include for example the use of separate and distinct positive and negative current sources which are balanced to provide equal amplitude output signals but of opposite polarity. Likewise current sources having different structure than that illustrated in the preferred embodiment can successfully be employed. Further the various logic and switching circuits of the present invention can be varied in any suitable manner to provide the desired paired transitional switching of the current source. It is noted that the current rebalancing period can be divided in any suitable manner instead of that shown by the waveforms of FIG. 4. Thus for example the first three timing pulse intervals could supply the opposite polarity pulse while the remaining timing pulse intervals provided the primary current rebalancing pulse polarity. These and other modifications of the present invention are within the scope of the present invention as defined by the appended claims.

The embodiments of the invention in which an exclusive property or privilege is claimed are defined as follows:

1. An analog to digital converter comprising:
an integrating circuit,
means for applying an analog signal to said integrating circuit;
a comparator coupled to said integrator for developing a control signal when the amplitude of the output signal from said integrator exceeds a predetermined level;
a source of pulses,
an output terminal,
means for selectively coupling said source of pulses to said output terminal upon development of said control signal,
circuit means including a current source coupled to said integrating circuit and to said selective coupling means, and
logic means coupled to said comparator and to said source of pulses for actuating said current source to apply rebalance current pulses to said integrator circuit wherein said rebalance current pulse opposes current applied to said integrator due to said applied analog signal, each rebalance current pulse having positive and negative polarity components, said positive component being unequal in time duration to said negative component thereby providing a net rebalance current flow to or from said integrator, whereby the number of pulses produced at the said output terminal are directly proportioned to the input analog signal applied to the said integrator circuit.

* * * * *